(12) United States Patent
Purser et al.

(10) Patent No.: US 7,807,983 B2
(45) Date of Patent: Oct. 5, 2010

(54) TECHNIQUE FOR REDUCING MAGNETIC FIELDS AT AN IMPLANT LOCATION

(75) Inventors: Kenneth H. Purser, Lexington, MA (US); James S. Buff, Brookline, NH (US); Victor Benveniste, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 288 days.

(21) Appl. No.: 11/622,619

(22) Filed: Jan. 12, 2007

(65) Prior Publication Data

US 2008/0169426 A1    Jul. 17, 2008

(51) Int. Cl.
H01J 37/317    (2006.01)
H01J 37/141    (2006.01)
H01J 37/153    (2006.01)

(52) U.S. Cl. .................................... 250/492.21
(58) Field of Classification Search ............. 250/492.21
See application file for complete search history.

(56) References Cited

U.S. PATENT DOCUMENTS 3,993,509 A * 11/1976 McGinty ................. 250/492.2
6,933,507 B2    8/2005 Purser et al.
7,105,839 B2    9/2006 White
7,276,711 B2 * 10/2007 Kawaguchi et al. .... 250/492.21
2004/0097058 A1    5/2004 Purser et al.
2005/0017202 A1    1/2005 White
2005/0082498 A1    4/2005 White

FOREIGN PATENT DOCUMENTS

EP    1662541    5/2006
WO    WO8202623    8/1982

OTHER PUBLICATIONS

Harald A. Enge, "Deflecting Magnets", Focusing of Charged Particles, vol. II, Chaper 4.2, p. 203-264, Academic Press Inc., 1967.
N.R. White, et al; "Positive Control Uniformity in Ribbon Beams for Implantation of Flat-Panel Displays"; IEEE 1999; pp. 354-357.

* cited by examiner

*Primary Examiner*—Jack I Berman

(57) ABSTRACT

A technique for reducing magnetic fields at an implant location is disclosed. In one particular exemplary embodiment, the technique may be realized as an apparatus and method for reducing magnetic fields at an implant location. The apparatus and method may comprise a corrector-bar assembly comprising a set of magnetic core members, a plurality of coils distributed along the set of magnetic core members, and connecting elements to connect ends of the set of magnetic core members with each other to form a rectangular corrector-bar configuration. The corrector-bar assembly may be positioned at an exit region of a magnetic deflector to improve uniformity of a ribbon beam having a plurality of beamlets exiting from the magnetic deflector and the rectangular corrector-bar configuration may provide a desired magnetic field clamping action.

16 Claims, 6 Drawing Sheets

TECHNIQUE FOR REDUCING MAGNETIC FIELDS AT AN IMPLANT LOCATION

CROSS-REFERENCE TO RELATED APPLICATIONS

This patent application is related to U.S. patent application Ser. No. 10/619,702, filed Jul. 15, 2003, now U.S. Pat. No. 6,933,507, which is hereby incorporated by reference herein in its entirety.

FIELD OF THE DISCLOSURE

The present disclosure relates generally to plasma-based ion implantation and, more particularly, to a technique for reducing magnetic fields at an implant location.

BACKGROUND OF THE DISCLOSURE

Ion implanters are widely used in semiconductor manufacturing to selectively alter conductivity of materials. In a typical ion implanter, ions generated from an ion source are directed through a series of beam-line components which include one or more analyzing magnets and a plurality of electrodes. The analyzing magnets select desired ion species, filter out contaminant species and ions having incorrect energies, and adjust ion beam quality at a target wafer. Suitably shaped electrodes can be used to modify the energy and the shape of an ion beam.

In production, semiconductor wafers are typically scanned with an ion beam. As used hereinafter, "scanning" of an ion beam refers to the relative movement of an ion beam with respect to a wafer or substrate surface.

An ion beam is typically either a "spot beam" having an approximately circular or elliptical cross section or a "ribbon beam" having a rectangular cross section. For the purpose of the present disclosure, a "ribbon beam" may refer to either a static ribbon beam or a scanned ribbon beam. The latter type of ribbon beam may be created by scanning a spot beam back and forth at a high frequency.

In the case of a spot beam, scanning of a wafer may be achieved by sweeping the spot beam back and forth between two endpoints to form a beam path and by simultaneously moving the wafer across the beam path. Alternatively, the spot beam may be kept stationary, and the wafer may be moved in a two-dimensional (2-D) pattern with respect to the spot beam. In the case of a ribbon beam, scanning of a wafer may be achieved by keeping the ribbon beam stationary and by simultaneously moving the wafer across the ribbon beam. If the ribbon beam is wider than the wafer, a one-dimensional (1-D) movement of the wafer may cause the ribbon beam to cover the entire wafer surface. The much simpler 1-D scanning makes a ribbon beam a desired choice for single-wafer ion implantation production.

However, just like spot beams, ribbon beams can suffer from intrinsic non-uniformity problems. A ribbon beam typically consists of a plurality of beamlets, wherein each beamlet may be considered, conceptually, as one spot beam. Though beamlets within a ribbon beam travel in the same general direction, any two beamlets may not be pointing in exactly the same direction. In addition, each beamlet may have an intrinsic angle spread. As a result, during ion implantation with a ribbon beam, different locations on a target wafer may experience different ion incident angles. Furthermore, the beamlets may not be evenly spaced within the ribbon beam. One portion of the ribbon beam where beamlets are densely distributed may deliver a higher ion dose than another portion of the ribbon beam where beamlets are sparsely distributed. Therefore, a ribbon beam may lack angle uniformity and/or dose uniformity.

Although there have been attempts to improve either angle uniformity or dose uniformity of a ribbon beam, an efficient solution has not been made available for providing ribbon beams that meet both dose and angle uniformity requirements for ion implantation production. For example, it is typically required that a ribbon beam should produce, in a wafer plane, a dose uniformity with less than 1% variations together with an angle uniformity with less than 0.5° variations. Such stringent uniformity requirements are difficult to meet since both types of uniformity may be elusive.

These requirements tend to minimize the movement of electrons across a surface of a target wafer being implanted. Any such movement may lead to the generation of substantial local potential differences and implantation non-uniformities, which may in turn lead to electrical breakdowns between circuit elements. As a result, it has been found that when a magnetic field at a target wafer is substantially greater than that of the earth's magnetic field, non-uniform electron distributions may occur, resulting in increased breakdown and non-uniformity in dose distribution.

FIG. 1 depicts a common geometry 100 for implanting ions onto a target wafer. A ribbon beam 10, which typically exits from a mass selection slit (not shown), enters a magnetic deflector 101 at an entrance region. The magnetic deflector 101 deflects the incoming ribbon beam 10 to provide a mass-analyzed beam suitable for implantation of a target wafer 103 at an implantation station 102. In this specific geometry 100, a corrector-bar pair 104 may be introduced at the exit region of the magnetic deflector 101 to produce uniformity across the target wafer.

Referring to FIG. 2, the corrector-bar pair 104 includes a pair of horizontal magnetic core members, such as an upper steel bar 202 and a lower steel bar 204, that form a gap or space 206 to allow the ribbon beam 10 to pass therethrough. The corrector-bar pair 104 provides a magnetic supporting structure needed for producing desired deflection fields. A plurality of coils 208 may be wound along the upper steel bar 202 and the lower steal bar 204. Each coil 208 may be individually and/or independently excited with a current, so as to generate high-order multipole components without dedicated windings. Individual excitation of each coil 208, or each multipole, may deflect one or more beamlets within the ribbon beam 10. That is, local variations in ion density or shape of the ribbon beam 10 may be corrected by modifying the magnetic fields locally. These corrections may be made under computer control and on a time scale that is only limited by a decay rate of eddy currents in the horizontal magnetic core members 202, 204.

The distance 106 between the exit region of the magnetic deflector 101 and the target wafer 103, as depicted in FIG. 1, is typically quite short. As a result, the short distance 106 may cause a fringing field, which originates from the top of the magnetic deflector 101, to be undesirably intense.

One common solution for minimizing such fringing fields is achieved by integrating an additional component that provides magnetic field suppression into the geometry or design for ion implantation 100.

For example, FIG. 3 depicts a schematic of a magnetic clamp 300, which may be inserted immediately following the exit region of the magnetic deflector 101. The magnetic clamp 300 is essentially a rectangular box, including a first pair of horizontal steel plates 302 that are connected together by a second pair of vertical plates 304. The second pair of vertical plates 304 provides an effective technique for magnetically shorting the first pair of horizontal plates 302 together. The magnetic clamp 300 also includes an opening or channel 306 through which the ribbon beam 10 passes. Fringing magnetic flux B 308 originating from the pole of the magnetic deflector 101 enters the top horizontal steel plate 302 and exits through the bottom horizontal steel plate 302, causing fringing fields to be substantially attenuated. However, the use of a magnetic clamp in conjunction with a corrector-bar pair is inefficient and does not adequately solve the problems discussed above.

In view of the foregoing, it would be desirable to provide a technique for reducing magnetic fields at an implant location to overcome the above-described inadequacies and shortcomings.

SUMMARY OF THE DISCLOSURE

A technique for reducing magnetic fields at an implant location is disclosed. In accordance with one particular exemplary embodiment, the technique may be realized as an apparatus for reducing magnetic fields at an implant location. The apparatus may comprise a corrector-bar assembly comprising a set of magnetic core members, a plurality of coils distributed along the set of magnetic core members, and connecting elements to connect ends of the set of magnetic core members with each other to form a rectangular corrector-bar configuration. The apparatus may also comprise a set of magnetic core members that are parallel with each other. The apparatus may additionally comprise a plurality of coils comprising a central group of coils, a first auxiliary group of coils positioned on a first side of the central group of coils, and a second auxiliary group of coils positioned on a second side of the central group of coils.

In accordance with other aspects of this particular exemplary embodiment, the corrector-bar assembly is positioned at an exit region of a magnetic deflector to improve uniformity of a ribbon beam having a plurality of beamlets exiting from the magnetic deflector.

In accordance with further aspects of this particular exemplary embodiment, the central group of coils is individually excited to deflect at least one beamlet to provide dose and angle uniformity associated with the ribbon beam exiting the corrector-bar assembly.

In accordance with additional aspects of this particular exemplary embodiment, the first and second auxiliary group of coils provides a compensatory effect to a magnetostatic potential generated by the central group of coils by adding to or subtracting from the magnetostatic potential generated by the central group of coils so that the sum of the magnetostatic potential along a length of the set of magnetic core members is zero.

In accordance with further aspects of this particular exemplary embodiment, the connecting elements comprise high-permeability steel elements and provide short-circuit connectivity to the set of magnetic core members.

In accordance with another aspect of this particular exemplary embodiment, the rectangular corrector-bar configuration provides a desired magnetic field clamping action.

In accordance with another exemplary embodiment, the apparatus further comprises a steel skirt element positioned at the exit region of the magnetic deflector between the magnetic deflector and the corrector-bar assembly, wherein the steel skirt element provides a magnetic flux in an opposite direction of a magnetic deflection flux of the magnetic deflector to neutralize fringing field effects at the exit region and stray fields affecting the corrector-bar assembly.

In accordance with yet another exemplary embodiment, the apparatus further comprises a thin sheet of high-permeability steel positioned immediately below a target wafer to ensure magnetic fields arrive normally at a surface of the target wafer.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure improve upon the above-described corrector-bar technique by providing dose uniformity and angle uniformity in a ribbon beam. In addition, embodiments of the present disclosure provide a corrector-bar configuration that may accomplish beam clamping and other corrector-bar operations.

Figure 4:
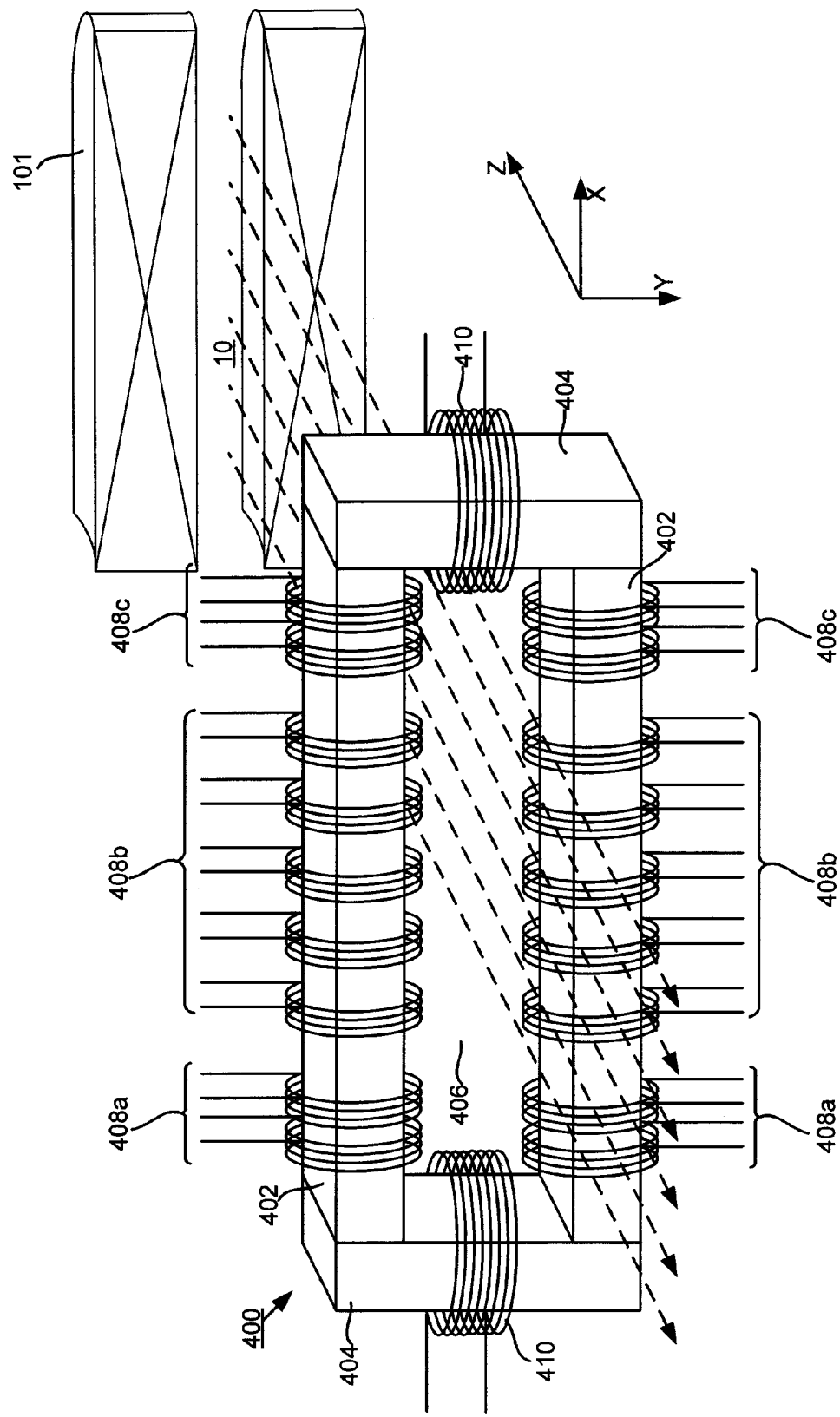
FIG. 4 depicts a corrector-bar configuration according to an embodiment of the present disclosure.

Referring to FIG. 4, a corrector-bar assembly 400 is shown in accordance with an embodiment of the present disclosure. The corrector-bar assembly 400 may include a set of magnetic core members 402, a plurality of coils 408 distributed along the set of magnetic core members 402, and connecting elements 404 to connect ends of the set of magnetic core members 402 with each other to form a rectangular corrector-bar configuration. The corrector-bar assembly 400 also includes an opening or channel 406 through which a ribbon beam 10 passes. In one embodiment, the magnetic core members 402 and the connecting elements 404 may be formed of a high-permeability steel material. In another embodiment, the corrector-bar assembly 400 may be positioned at an exit region of a magnetic deflector 101 to improve uniformity of a ribbon beam 10 having a plurality of beamlets exiting from the magnetic deflector 101.

The set of magnetic core members 402 of the corrector-bar assembly 400 may be parallel with each other. Furthermore, the plurality of coils 408 distributed along the length of the magnetic core members 402 may include a central group of coils 408b, a first auxiliary group of coils 408a positioned on one side of the central group of coils, and a second auxiliary group of coils 408c positioned on the other side of the central group of coils.

In one embodiment, the central group of coils 408b may be individually excited to deflect at least one beamlet to provide dose uniformity associated with the ribbon beam 10 exiting the corrector-bar assembly 400. In another embodiment, the central group of coils 408b may be individually excited to deflect at least one beamlet to provide angle uniformity associated with the ribbon beam 10 exiting the corrector-bar assembly 400.

Additional coils 410 may also be wound around the connecting elements 404 to eliminate magnetic short circuits when multipole components are being generated. These additional coils 410 may also be excited independently to produce a pure dipole field in the Y direction between the magnetic core members 402. When the additional coils 410 are switched off, dipole fields may be generated in the X direction along the magnetic core members 402. These X- or Y-direction dipole fields may also be used to manipulate the ribbon beam 10 or individual beamlets therein.

Individual excitation of the plurality of coils 408, 410 may be provided by a controller (not shown). The controller may also include measurement devices useful for calibrating excitation levels to produce the desired amount of deflection to at least one beamlet.

The first auxiliary group of coils 408a and the second auxiliary group of coils 408c may provide a compensatory effect to a magnetostatic potential generated by the central group of coils 408b by adding to or subtracting from the magnetostatic potential generated by the central group of coils 408b so that the sum of the magnetostatic potential along the length of the set of magnetic core members is zero. This compensatory effect of the first and second auxiliary coils 408a, 408c may substantially reduce magnetic flux at the ends of the corrector-bar assembly 400. As a result, no magnetic flux may be permitted to leave the ends of each of the magnetic core members 402. In addition, the compensatory effect produced at the parallel set of magnetic core members 402 may enhance the individual fields crossing the plane of symmetry between the set of magnetic core members 402 to provide a corrector-bar assembly 400 that satisfies a continuity requirement of Maxwell's equations so that a divergence of field vector B is zero. As a result, when the magnetic deflector or dipole magnet 101 is not energized, the connecting elements 404 may connect the ends of the set of parallel magnetic core members 402 to form a rectangular corrector-bar configuration without substantial flux passing through the ends of the magnetic core members 402.

Figure 1:
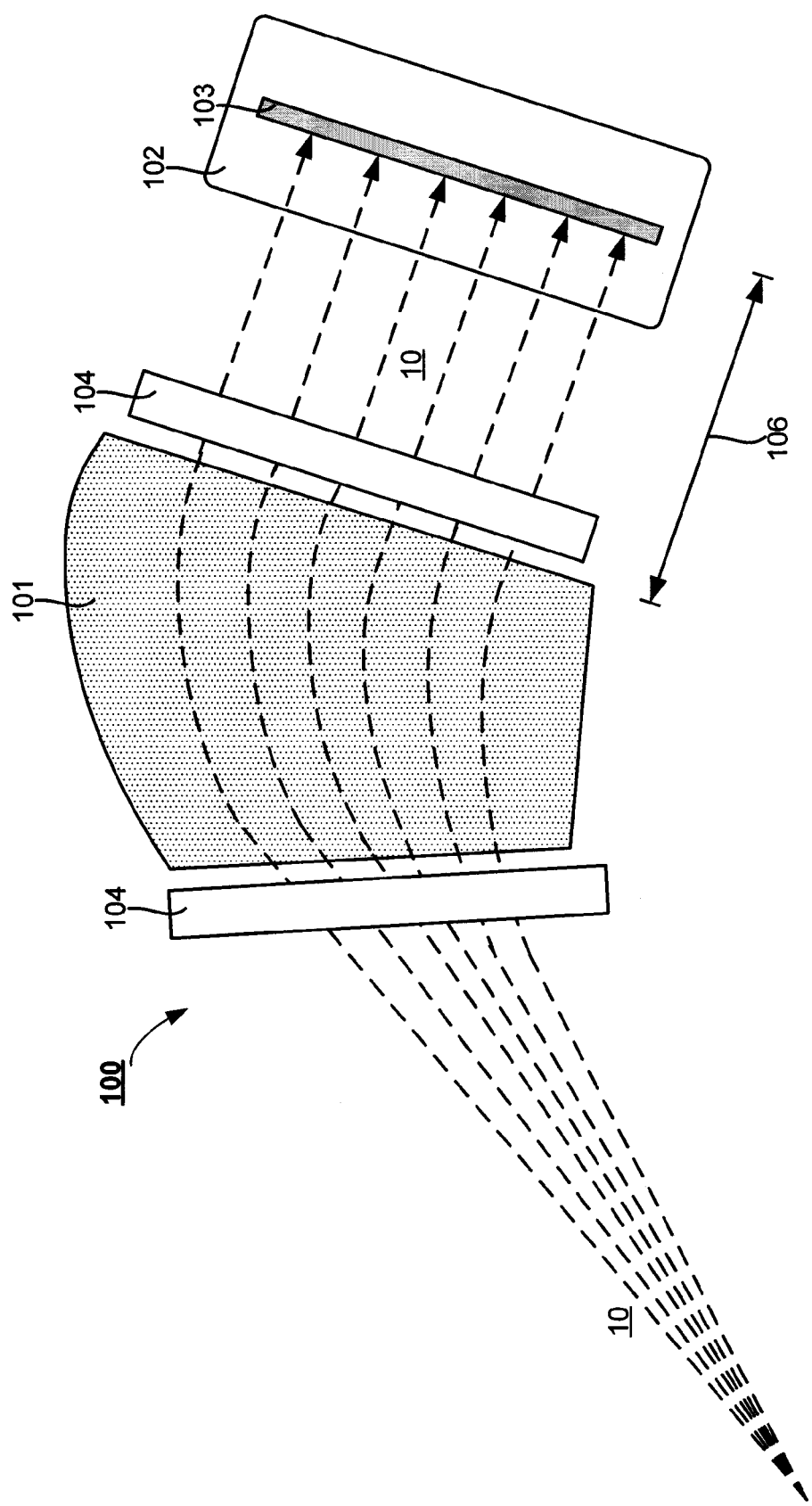
FIG. 1 depicts a conventional ion implantation configuration.
Figure 2:
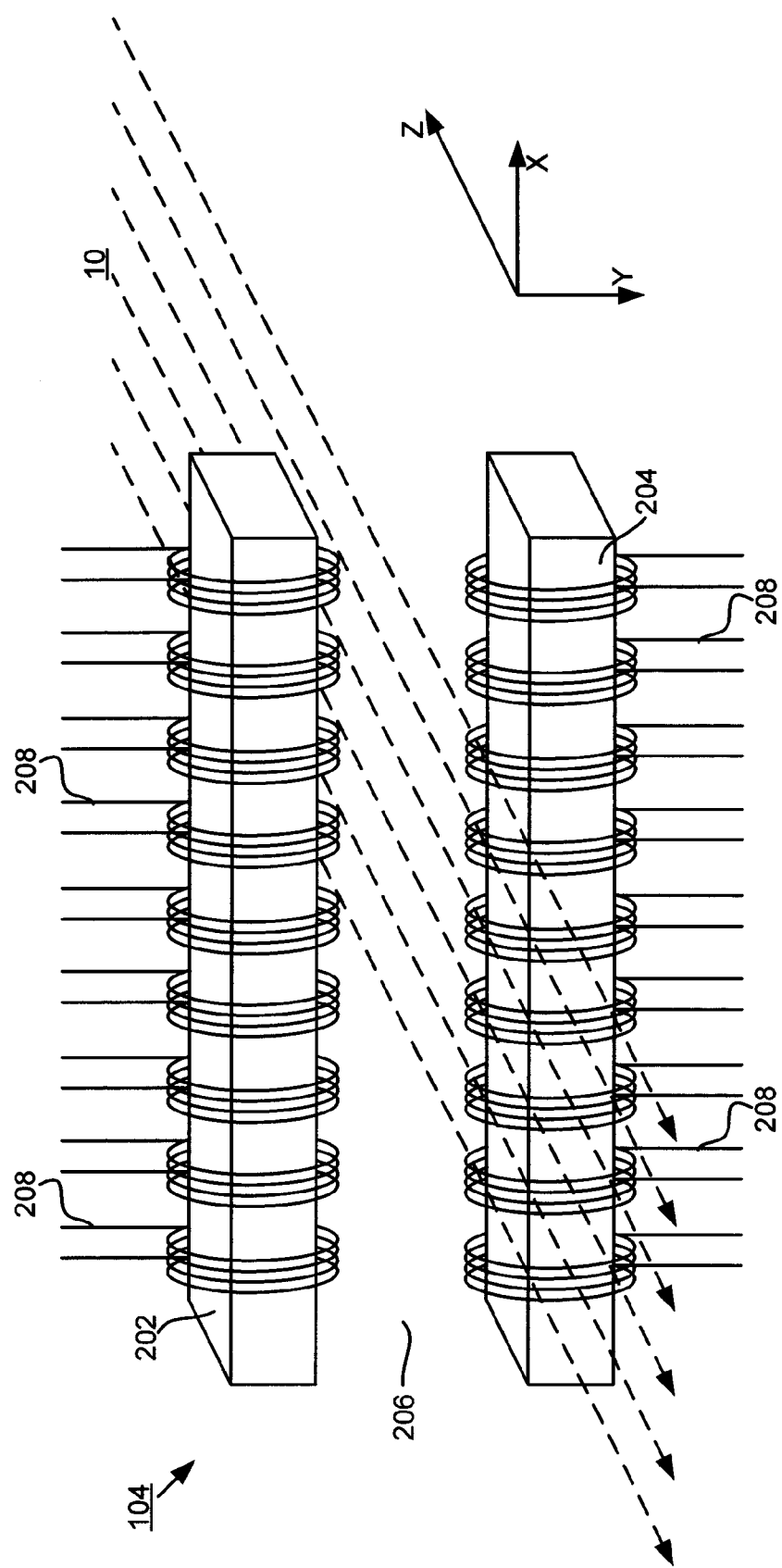
FIG. 2 depicts a conventional corrector-bar pair configuration.
Figure 3:
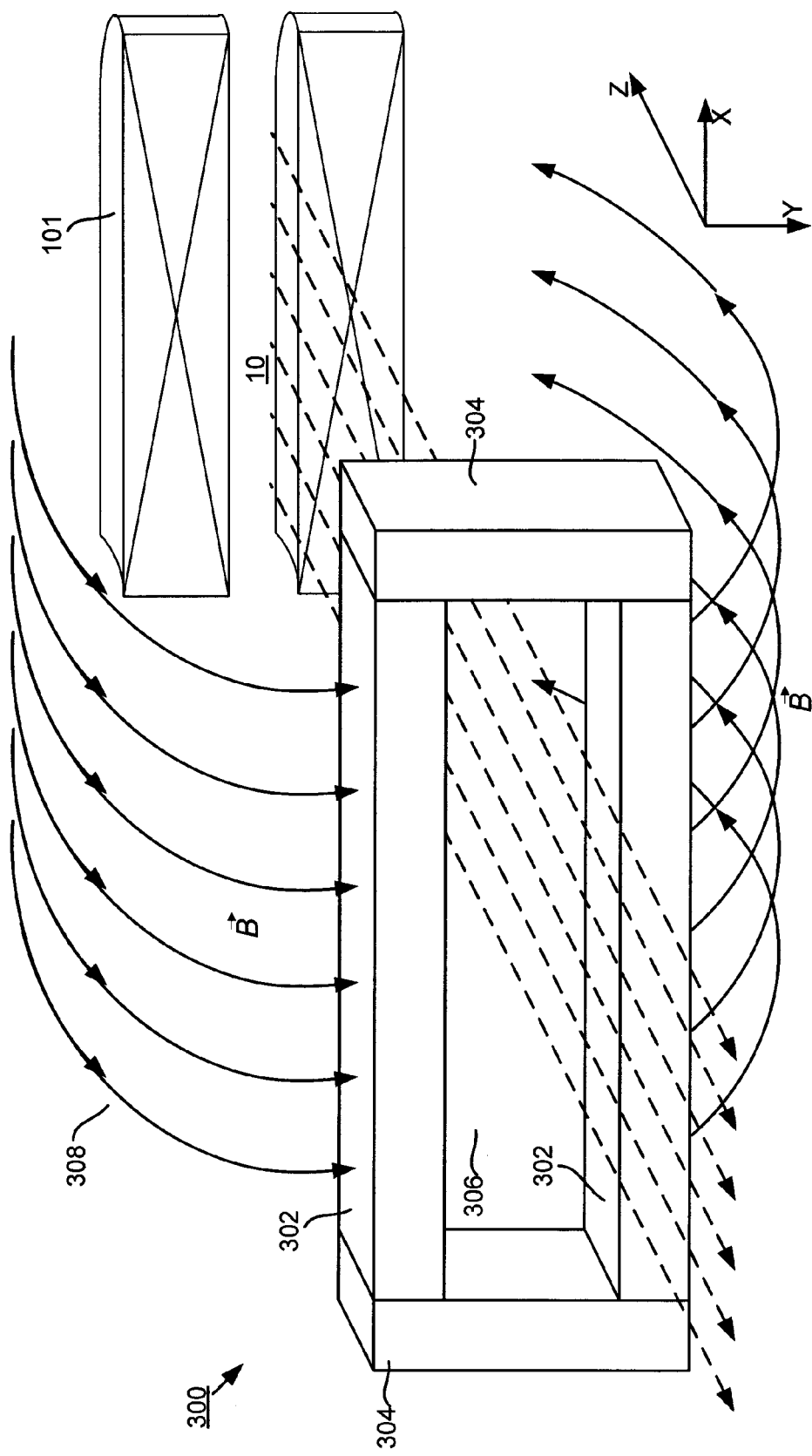
FIG. 3 depicts a conventional magnetic clamp configuration.

However, when the magnetic deflector 101 is energized, the fringing field 308 produced by the magnetic deflector 101, as depicted in FIG. 3, may enter the set of magnetic core members 402. But because the connecting elements 404 that connect the magnetic core members 402 to form a rectangular corrector-bar configuration effectively provide a "short-circuit," the corrector-bar assembly 400 may effectively perform a beam clamping action as well. As a result, magnetic fields arising from beam clamping fringing fields from the magnetic deflector 101 and uniformity correction from the plurality of individually excited coils 408 may be superimposed linearly, assuming that the fields are small enough for saturation effects of the steel material to be ignored. Moreover, it should be appreciated that an adequate steel cross section may also be included in the configuration of the corrector-bar assembly 400 so that substantial fluxes may pass along the magnetic core members 402 and the connecting elements 404. Various dimensions for an adequate steel cross section may be provided as long as field density in the steel is low enough for saturation effects to be ignored.

However, if saturation effects are substantial enough to affect the beam uniformity and clamping actions of the corrector-bar assembly 400, additional steel cross section may need to be included to further avoid non-linearity problems.

Figure 5:
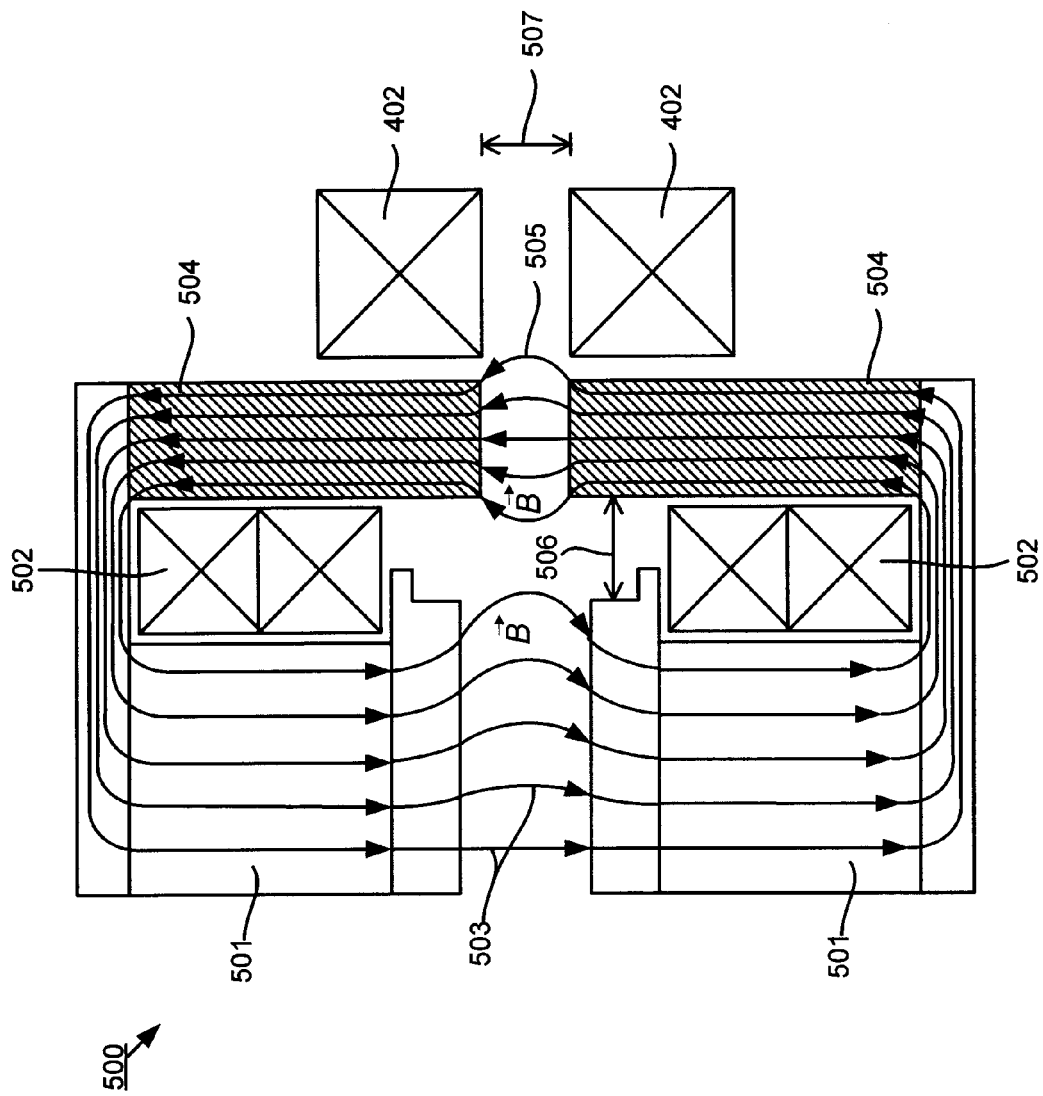
FIG. 5 depicts a magnetic deflector having a steel skirt configuration according to an embodiment of the present disclosure.

FIG. 5 depicts a magnetic deflector assembly 500 according to an embodiment of the present disclosure. The magnetic deflector assembly 500 may include a magnetic deflector 501 and a plurality of exciting coils 502 that, when energized, may generate a primary magnetic deflection or dipole flux 503. (The fringing field 308, as depicted in FIG. 3, is generated as a result of the primary magnetic dipole flux 503.) The magnetic deflector assembly 500 may also include a steel skirt element 504 positioned between the exit region of the magnetic deflector 501, outside of the exciting coils 502, and the corrector-bar assembly 400 to provide compensatory field or flux 505 that runs in an opposite direction of the primary magnetic dipole flux 503. In one embodiment, by adjusting the gap 506 between the magnetic deflector 501 and the steel skirt elements 504 and the gap 507 between the steel skirt elements themselves 504, the magnetic deflector assembly 500 may neutralize undesired fringing field effects at the exit region and substantially reduce stray fields affecting other neighboring components, e.g., the corrector-bar assembly 400.

Figure 6:
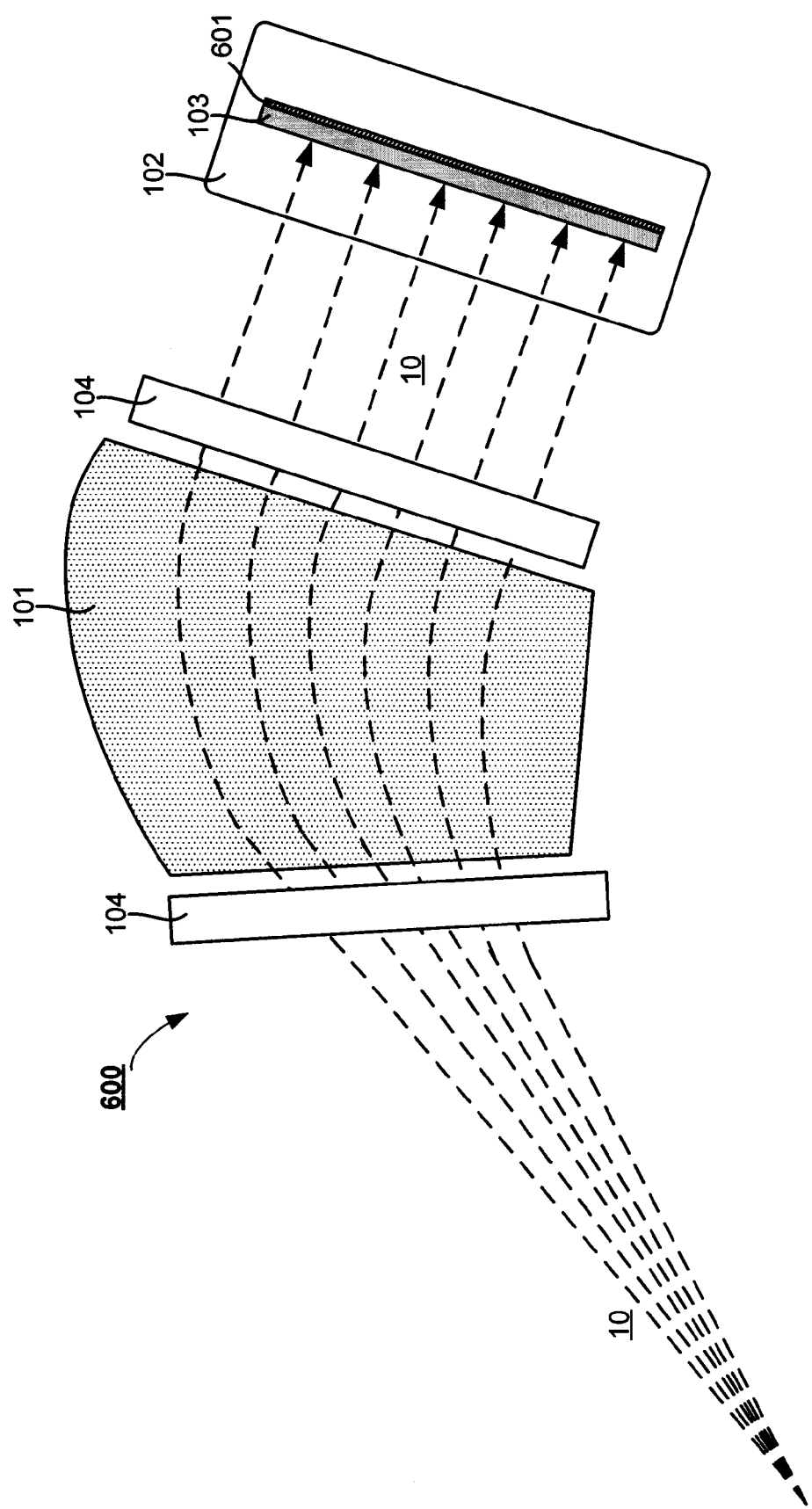
FIG. 6 depicts an ion implantation configuration according to an embodiment of the present invention.

FIG. 6 depicts an ion implantation configuration 600 according to another embodiment of the present disclosure. In this example, a thin sheet 601 made of metal, e.g., high-permeability steel, may be placed immediately beneath the target wafer 103 within the implantation station 102. Providing this thin sheet 601 may further ensure that magnetic fields at an implant location arrive normally to the surface of a target wafer and provide satisfactory ion implantation. In one embodiment, the thin sheet 601 may be formed of a high permeability material, such as Permalloy material.

It should be appreciated that while embodiments of the present disclosure are directed to reducing magnetic fields at an ion implant location, other implementations may be provided as well. For example, the disclosed techniques for reducing magnetic fields may apply to other various ion implantation systems that use magnetic deflection or any other beam tuning systems.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

The invention claimed is:

1. An apparatus for reducing magnetic fields at an implant location, the system comprising:
   a corrector-bar assembly comprising a set of magnetic core members, a plurality of coils distributed along the set of magnetic core members, and connecting elements to connect ends of the set of magnetic core members with each other to form a rectangular corrector-bar configuration;

wherein the set of magnetic core members are parallel with each other;

wherein the plurality of coils comprises a central group of coils to generate a central magnetostatic potential, a first auxiliary group of coils positioned on a first side of the central group of coils, and a second auxiliary group of coils positioned on a second side of the central group of coils, wherein the first and second auxiliary group of coils generate a compensatory magnetostatic potential to add or subtract from the central magnetostatic potential so that a sum of magnetostatic potential along a length of the set of magnetic core members is zero; and wherein the rectangular corrector-bar configuration provides a desired magnetic field clamping action.

2. The apparatus of claim 1, wherein the corrector-bar assembly is positioned at an exit region of a magnetic deflector to improve uniformity of a ribbon beam having a plurality of beamlets exiting from the magnetic deflector.

3. The apparatus of claim 2, wherein the central group of coils is individually excited to deflect at least one beamlet.

4. The apparatus of claim 3, wherein the central group of coils is individually excited to deflect at least one beamlet to provide dose and angle uniformity associated with the ribbon beam exiting the corrector-bar assembly.

5. The apparatus of claim 1, wherein the connecting elements comprise high-permeability steel elements.

6. The apparatus of claim 1, wherein the connecting elements provide short-circuit connectivity to the set of magnetic core members.

7. The apparatus of claim 2, further comprising:
a steel skirt element positioned at the exit region of the magnetic deflector between the magnetic deflector and the corrector-bar assembly, wherein the steel skirt element provides a magnetic flux in an opposite direction of a magnetic deflection flux of the magnetic deflector to neutralize fringing field effects at the exit region and stray fields affecting the corrector-bar assembly.

8. The apparatus of claim 2, further comprising a thin sheet of high-permeability steel positioned immediately below a target wafer to ensure magnetic fields arrive normally at a surface of the target wafer.

9. A method for reducing magnetic fields at an implant location, the method comprising:
providing a corrector-bar assembly comprising a set of magnetic core members, a plurality of coils distributed along the set of magnetic core members, and connecting elements to connect ends of the set of magnetic core members with each other to form a rectangular corrector-bar configuration;

wherein the set of magnetic core members are parallel with each other;

wherein the plurality of coils comprises a central group of coils to generate a central magnetostatic potential, a first auxiliary group of coils positioned on a first side of the central group of coils, and a second auxiliary group of coils positioned on a second side of the central group of coils, wherein the first and second auxiliary group of coils generate a compensatory magnetostatic potential to add or subtract from the central magnetostatic potential so that a sum of magnetostatic potential along a length of the set of magnetic core members is zero; and wherein the rectangular corrector-bar configuration provides a desired magnetic field clamping action.

10. The method of claim 9, wherein the corrector-bar assembly is positioned at an exit region of a magnetic deflector to improve uniformity of a ribbon beam having a plurality of beamlets exiting from the magnetic deflector.

11. The method of claim 10, wherein the central group of coils is individually excited to deflect at least one beamlet.

12. The method of claim 11, wherein the central group of coils is individually excited to deflect at least one beamlet to provide dose and angle uniformity associated with the ribbon beam exiting the corrector-bar assembly.

13. The method of claim 9, wherein the connecting elements comprise high-permeability steel elements.

14. The method of claim 9, wherein the connecting elements provide short-circuit connectivity to the set of magnetic core members.

15. The method of claim 10, further comprising: positioning a steel skirt element at the exit region of the magnetic deflector between the magnetic deflector and the corrector-bar assembly, wherein the steel skirt element provides a magnetic flux in an opposite direction of a magnetic deflection flux of the magnetic deflector to neutralize fringing field effects at the exit region and stray fields affecting the corrector-bar assembly.

16. The method of claim 10, further comprising providing a thin sheet of high-permeability steel immediately beneath a target wafer to ensure magnetic fields arrive normally at a surface of the target wafer.

* * * * *